(12) United States Patent
Jain et al.

(10) Patent No.: US 7,688,240 B2
(45) Date of Patent: Mar. 30, 2010

(54) METHOD AND APPARATUS FOR CALIBRATING AN RDAC FOR END-TO-END TOLERANCE CORRECTION OF OUTPUT RESISTANCE

(75) Inventors: Dinesh Jain, Bangalore (IN); Kaushal Kumar Jha, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 9 days.

(21) Appl. No.: 12/113,946

(22) Filed: May 2, 2008

(65) Prior Publication Data

US 2009/0273497 A1 Nov. 5, 2009

(51) Int. Cl.
*H03M 1/10* (2006.01)
(52) U.S. Cl. ...................... 341/120; 341/144
(58) Field of Classification Search ................. 341/154, 341/118, 120, 144
See application file for complete search history.

(56) References Cited

U.S. PATENT DOCUMENTS

| | | | | |
|---|---|---|---|---|
| 4,829,236 A * | 5/1989 | Brenardi et al. | ............... | 324/74 |
| 5,495,245 A * | 2/1996 | Ashe | ................. | 341/145 |
| 6,204,785 B1 * | 3/2001 | Fattaruso et al. | ............ | 341/120 |
| 6,392,578 B1 * | 5/2002 | Russell | ................. | 341/144 |
| 7,002,496 B2 * | 2/2006 | Kuyel | ................. | 341/120 |
| 7,154,425 B2 * | 12/2006 | Venditti et al. | .............. | 341/155 |
| 2005/0146452 A1 | 7/2005 | Kuyel | | |

OTHER PUBLICATIONS

PCT International Search Report and Written Opinion for PCT/US2009/002648 mailed on Oct. 7, 2009.

* cited by examiner

*Primary Examiner*—Peguy JeanPierre
(74) *Attorney, Agent, or Firm*—Kenyon & Kenyon LLP

(57) ABSTRACT

A system and method for calibrating an RDAC to obtain an expected resistance are disclosed. In one embodiment, a method of obtaining an expected resistance from an RDAC circuit includes receiving a digital signal comprising a digital code by an on-chip calibration code engine, automatically deriving a calibrated digital code based on resistance versus digital code characteristic curves of an expected RDAC and the RDAC associated with the calibration code engine, and inputting the calibrated digital code into the RDAC associated with the calibration code engine to obtain an expected resistance. The method also includes forming the resistance versus digital code characteristic curves of the expected RDAC and the RDAC, computing a gain error and an offset error using the formed resistance versus digital code characteristic curves of the RDAC and the expected RDAC and storing the gain error and the offset error in a non-volatile/volatile RDAC memory.

22 Claims, 5 Drawing Sheets

US 7,688,240 B2

METHOD AND APPARATUS FOR CALIBRATING AN RDAC FOR END-TO-END TOLERANCE CORRECTION OF OUTPUT RESISTANCE

FIELD OF THE INVENTION

The present invention relates to digital-to-analog converters (DACs). More particularly, the present invention relates to resistor DACs (RDACs).

BACKGROUND

Digital-to-analog converters (DACs) are widely used in electronic systems to receive a digital code and then generate an analog signal related to, or determined from, the received digital code. These types of converters are used most commonly as building blocks in metal oxide semiconductor (MOS) analog-to-digital conversion systems. For an N-bit voltage scaling DAC or resistor DAC (RDAC), the resistor string consists of $2^N$ identical resistors connected in series, and is used as a potentiometer and/or a rheostat, among other applications, in which the voltage levels between successive resistors are sampled by means of binary switches.

In the rheostat mode, the RDAC behaves as a code-dependent resistor. Due to manufacturing process variability, the critical dimensions and process parameters can affect circuit performance and can result in die-to-die variation of absolute output resistance. One such effect is due to systematic offsets in the process parameters, such as doping, oxide thickness, lateral diffusion, vertical implant depth, critical dimension variation and so on, that can result in the variation of sheet resistivity of resistive materials. This variation in sheet resistivity can be as high as 30-50% of normal value. Thus, the VLSI based RDACs when used in rheostat mode cannot compete on performance with a discrete resistor used as rheostat which has about 1% variation over the normal value.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A system and method for calibrating a resistor digital to analog converter (RDAC) are provided. In the following description, for purposes of explanation, numerous specific details are set forth in order to provide a thorough understanding of the various embodiments. It will be evident, however, to one skilled in the art that the various embodiments may be practiced without these specific details.

In describing the preferred embodiments, certain terminology will be utilized for the sake of clarity. Such terminology is intended to encompass the recited embodiment, as well as all technical equivalents, which operate in a similar manner for a similar purpose to achieve a similar result.

The terms "digital to analog converter (DAC)", "resistor digital to analog converter (RDAC)", "on-chip RDAC" and "N+1 bit RDAC" are used interchangeably throughout the document. Also the terms "calibration code engine" and "on-chip calibration code engine" are used interchangeably throughout the document.

Figure 1:
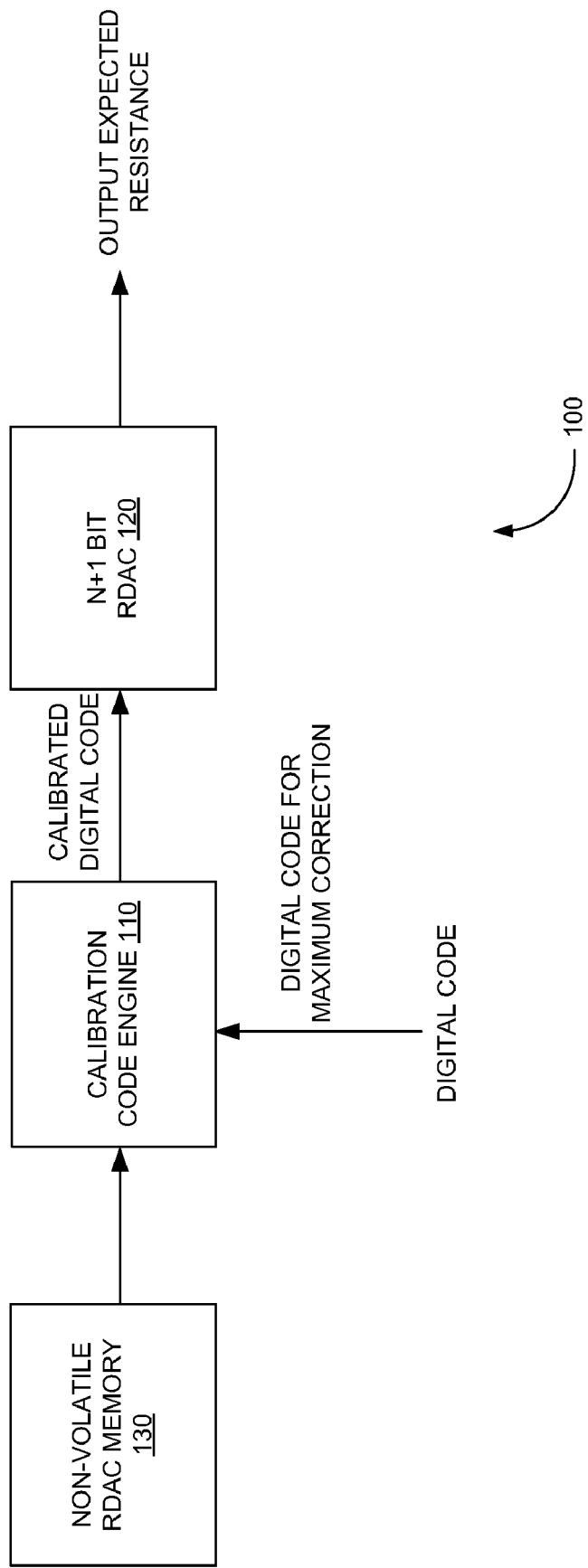
FIG. 1 is a block diagram of a resistor digital to analog converter (RDAC), according to an embodiment.

FIG. 1 is a block diagram of a resistor digital to analog converter (RDAC) circuit 100, according to an embodiment. Particularly, FIG. 1 illustrates a calibration code engine 110, an N+1 bit RDAC 120, and a non-volatile/volatile RDAC memory 130.

The calibration code engine 110 is configured to generate a calibrated digital code to a digital input array upon receiving a digital signal including a digital code. In some embodiments, the calibrated digital code is derived from resistance versus digital code characteristic curves of an expected RDAC and the RDAC 120 associated with the RDAC circuit 100.

Further, the RDAC 120 is configured to receive the calibrated digital code and output an expected resistance. In these embodiments, the RDAC 120 is coupled to the calibration code engine 110 to receive the generated calibrated digital code. In some embodiments, the digital to analog converter circuit 100 includes the digital input array and an analog output node.

In operation, the digital signal including a digital code is received by the calibration code engine 110 (e.g., coupled to the RDAC 120). Further, the calibrated digital code is automatically derived based on resistance versus digital code characteristic curves of the expected RDAC and the RDAC 120 (e.g., the characteristic curves 302 and 304 of FIG. 3 respectively). In these embodiments, the calibrated digital code is automatically derived based on parameters associated with the resistance versus digital code characteristic curves of the expected RDAC and the RDAC 120. In some embodiments, the parameters include an offset error and a gain error.

Further, automatically deriving the calibrated digital code includes computing the calibrated digital code for each received digital code using the offset error and the gain error. The offset error and the gain error are computed using the resistance versus digital code characteristic curves of the expected RDAC and the RDAC 120. The RDAC circuit 100 further includes a memory to store parameters (e.g., the offset error and the gain error) associated with the resistance versus digital code characteristic curve of the RDAC 120. In some embodiments, the memory includes a non-volatile/volatile RDAC memory (e.g., the non-volatile/volatile RDAC memory 130).

Further, automatically deriving the calibrated digital code includes forming a look-up table of the received digital codes versus associated calibrated digital codes, storing the look-up table in the non-volatile/volatile RDAC memory 130, and automatically obtaining the calibrated digital code for the received digital code using the stored look-up table.

For example, systematic offsets in the process parameters, such as doping, oxide thickness, lateral diffusion, vertical implant depth, critical dimension variation, etc., may result in the variation of sheet resistivity of the resistive material (e.g., the unit elements of the RDAC 120). Therefore, end-to-end tolerance of the output resistance of the RDAC 120 is varied (e.g., either reduced or increased) due to the variation in sheet resistivity. As a result, the magnitude of the output resistance is not proportional to the magnitude of the received digital input value. Therefore, the calibration code engine 110 calibrates the output resistance of the RDAC 120 for an end-to-end tolerance.

In operation, the calibrated digital code is inputted into the RDAC 120 to obtain the expected resistance. In these embodiments, the digital code includes N bits and the DAC 120 is configured to computationally process N plus one or more bits of digital input. In one example embodiment, the highest priority specification for the calibration code engine 110 is linearity error (e.g., integral non-linearity (INL) error and differential non-linearity (DNL) error) being less than 1 LSB, i.e., |INL|<1 LSB and |DNL|<1 LSB. In order to achieve the above specification, the resolution of the DAC 120 is increased by one or more bits. In the example embodiment illustrated in FIG. 1, N+1 bit RDAC 120 is used to computationally process the N bit digital input code. As a result, the INL and DNL errors can be maintained within the specification of maximum ±0.5 LSB, by providing excess resolution in the RDAC (i.e., the N+1 bit RDAC 120).

Further, an over-range is required in the RDAC 120 to accommodate a decrease in sheet resistivity of the unit elements of the RDAC 120 from a nominal value. In some embodiments, a maximum resistance of the DAC 120 is equal to or greater than a desired maximum resistance divided by an over range factor, the over range factor being equal to one minus a maximum expected sheet resistivity variation percentage. In one example embodiment, the desired maximum resistance is an expected resistance obtained when the variation of sheet resistivity is zero (i.e., the RDAC 120 is intended to produce an analog output signal of a magnitude, proportional to the magnitude of a received digital input signal in ideal conditions).

For example, as explained above, due to absolute variation in the sheet resistivity of all the unit elements of the RDAC 120, the total sheet resistivity could be less than the nominal value. Let an expected resistance be $R_{TOTAL}$ (KOhm) for a nominal value of the sheet resistivity. However, due to process variation, let the sheet resistivity (Rho) reduce by x % from nominal value. Therefore, a new resistance is calculated using $R_{TOTAL,\ NEW} = R_{TOTAL}*(1-x)$. Thus, the RDAC 120 needs to be over-ranged by $(1-x)^{-1}$ to allow trimming under actual condition.

Figure 2:
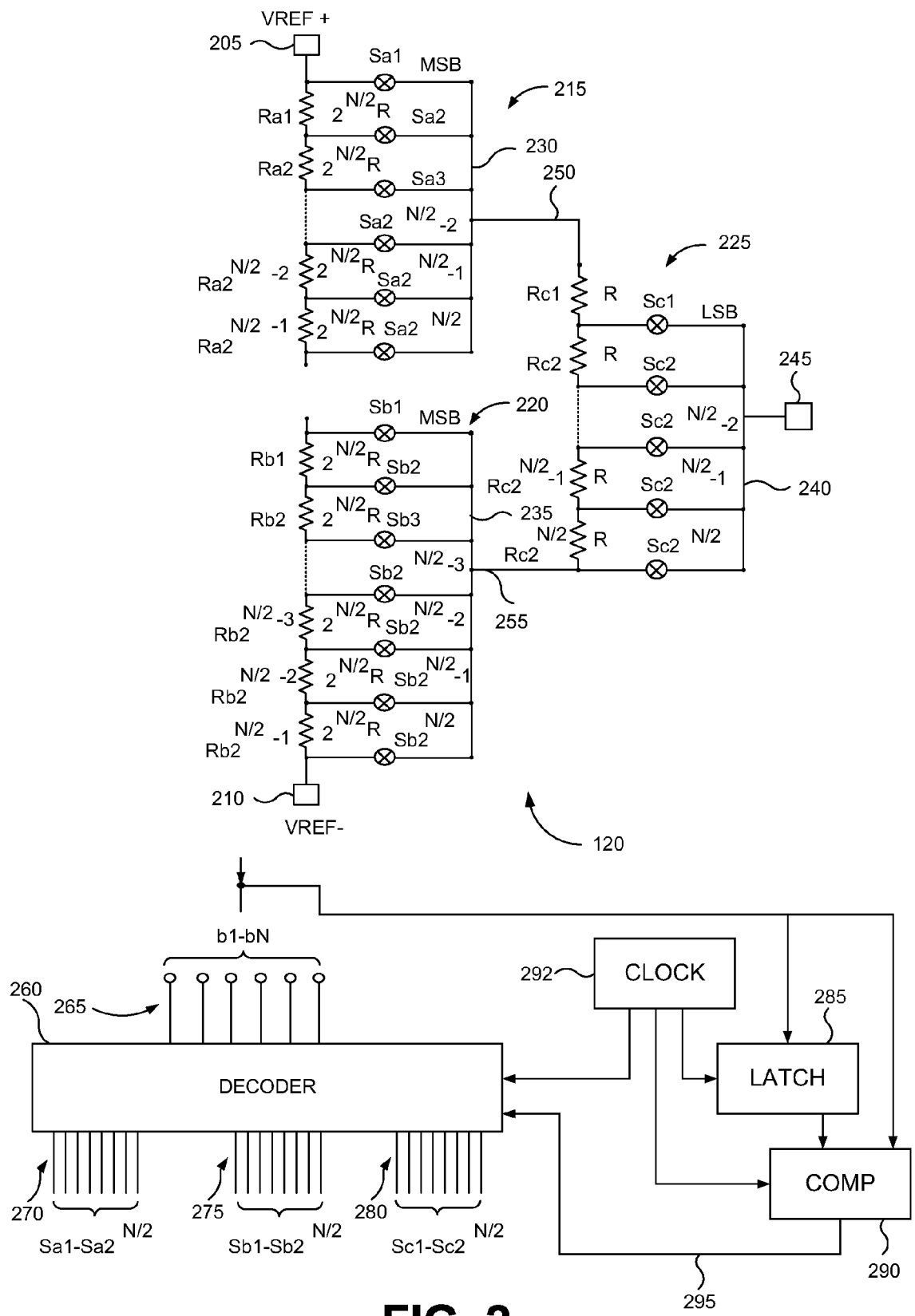
FIG. 2 is an example schematic diagram of a DAC that can be used in the RDAC shown in FIG. 1.

FIG. 2 is an example schematic diagram of a DAC that can be used in the RDAC 120 shown in FIG. 1. Outer resistor strings 215 and 220 in this example decrement input signals MSBs, while an inner string 225 decrements LSBs. The two outer string designs are identical. Each string consists of $2^{N/2}-1$ series connected resistors of equal resistance values $2^{N/2}R$, with switched taps from each end of the strings and from the junctions of successive resistors. The resistors of the first string are designated Ra and extend from Ra1 to Ra$2^{N/2}-1$, while the resistors of the second string are designated Rb and extend from Rb1 to Rb$2^{N/2}-1$. The outer ends of Ra1 and Rb$2^{N/2}-1$ are connected to VREF+205 and VREF−210, respectively, while the outer ends of resistors Ra$2^{N/2}-1$ and Rb1 are left open.

Individual switches within switch networks for resistor strings 215 and 220 are designated Sa and Sb, respectively. Switch Sa1 taps the outer end of Ra1, Sa2 taps the junction of Ra1 and Ra2, and so forth, until switch Sa$2^{N/2}-1$, which taps the outer end of resistor Ra$2^{N/2}-1$. Switches Sb1 through Sb$2^{N/2}-1$ are connected to similar tap points in the second string 220. The opposite ends of the Sa switches from the Ra resistors are all connected together in a first string output line 230, while the opposite ends of the switches Sb from the Rb resistors are all connected together in a second string output line 235.

The inner or LSB string 225 consists of $2^{N/2}$ resistors designated Rc1 through Rc$2^{N/2}$, each with a resistance value R, and $2^{N/2}$ switches designated Sc1 through Sc$2^{N/2}$. The opposite ends of the Sc switches from resistors Rc are all connected to a third string output line 240, which provides overall RDAC output at output terminal 245. An output buffer amplifier is not normally used if the RDAC 120 is used in a rheostat mode. The first switch Sc1 taps the junction of Rc1 and Rc2, with each successive switch tapping one successive resistor further down in the string until Sc$2^{N/2}$, which taps the outer end of resistor Rc$2^{N/2}$. With this configuration, the RDAC 120 is capable of $2^N$ output levels in 1 LSB increments, with the lowest level equal to VREF−. Alternatively, Sc1 could be tapped from the outer end of Rc1 and Sc$2^{N/2}$ could be tapped from the junction of the last two inner string resistors yielding an output swing from VREF− up to VREF+ minus one LSB, although the former arrangement produces a more conventional output range.

The outer end of the resistor Rc1 is connected to the first string output line 230 by a connector line 250, while the outer end of the last inner string resistor Rc$2^{N/2}$ is connected to the second string output line 235 by another connector line 255. A decoder 260 controls the operation of the switches so that one switch in each of the three resistor strings is closed for any given digital input, with all of the other switches open. The switch networks for the two outer strings 215 and 220 are controlled so that a total of $2^{N/2-1}$ resistors from the outer strings 215 and 220 are connected in series with the inner string 225 between VREF+205 or VREF−210 and the analog output node 245. Thus, for any given digital input there will be a total of $2^{N/2}-1$ resistors of resistance value $2^{N/2}R$ and $2^{N/2}$ resistors of resistance value R, to enable a total resistance of $2^N R$, connected between VREF+205 or VREF−210 and the analog output node 245.

The manner in which the switching is controlled to provide the RDAC conversion is explained as follows: the outer strings 215 and 220 consist of resistors Ra1-Ra7 and Rb1-Rb7 and switches Sa1-Sa8 and Sb1-Sb8, respectively; the inner string 225 consists of resistors Rc1-Rc8 and switches Sc1-Sc8. The three MSBs of the input digital signal are converted by the outer strings 215 and 220, while the three LSBs are converted by the inner string 225. For any given digital input, a total of seven outer string resistors plus the inner string 225 are connected in series between the VREF+205 or VREF−210 and the analog output node 245, and also since the total series resistance of the eight inner string resistors is equal to the resistance of a single outer string resistors, ⅛ of the voltage differential between the VREF+205 or VREF−210 and the analog output node 245 appears across the inner string 225. The remaining ⅞ of the VREF+205 or VREF−210 and the analog output node 245 differential is impressed across the portions of the outer strings 215 and 220 that are included in the switch circuit. The output resistance at node 245 is equal to the resistance at the tapped location of the lower outer string 220, plus the resistance added by the tapped portion of the inner string.

In accordance with one or embodiments described above, the RDAC 120 includes the high analog reference voltage node VREF+ 205 and the low analog reference voltage node VREF− 210, first and second separate outer strings 215 and 220 and of respective predetermined series connected resistors, and an inner string 225 of series connected resistors. The RDAC 120 further includes first and second outer switch networks connected respectively to the first and second outer resistor strings 215 and 220 to provide selectable unbuffered taps (i.e., from the outer resistor strings 215 and 220 to opposite ends of the inner resistor string 225) to provide a selectable tap from the inner resistor string 225 to the output node 245.

Further, as illustrated in FIG. 2, one end of the first outer resistor string 215 is connected to the high reference voltage node VREF+ 205 and one end of the second outer resistor string 220 is connected to the low reference voltage node VREF− 210, the resistors of each outer string 215 and 220 being connected directly in series. Also, the first and second outer resistor strings 215 and 220 have equal number of resistors with substantially equal resistances.

The RDAC 120 further includes a decoder 260 which responds to the received calibrated digital code by controlling the first and second outer switch networks to switch selected portions of the outer resistor strings 215 and 220 into a series connection with said inner resistor string 225. For example, the selected portions include a substantially constant aggregate series resistance over the switching ranges of the outer switch networks.

In addition, the decoder 260 further controls the inner switch network to tap the inner resistor string 225 at a location whose analog resistance level corresponds to the digital input signal. It can be noted that the number and resistance values of the resistors in the outer resistor strings 215 and 220 is decrementing the voltage between the high and low reference voltage nodes in a manner that corresponds to either the most significant bits (MSBs) or the least significant bits (LSBs) of the input digital signal, and the number and resistance values of the resistors in the inner resistor string 225 is decrementing the voltage between the outer resistor strings 215 and 220 in a manner that corresponds to the other of the MSBs and LSBs. Each MSB resistor string includes $2^{N/2}-1$ equal value resistors and each LSB resistor string includes $2^{N/2}$ equal value resistors. Further, the resistance value of each resistor in each MSB resistor string is $2^{N/2}$ times the resistance value of each resistor in each LSB resistor string.

In some embodiments, the decoder 260 alters the switching pattern of the outer switch networks in response to a change in the input digital signal by first altering the switch network for the outer strings 215. This results in an increase in the total resistance between the high or low reference voltage nodes VREF+ 205 and VREF− 210 and the analog output node 245, further, altering the switching pattern of the switch network for the other outer string 220.

Figure 3:
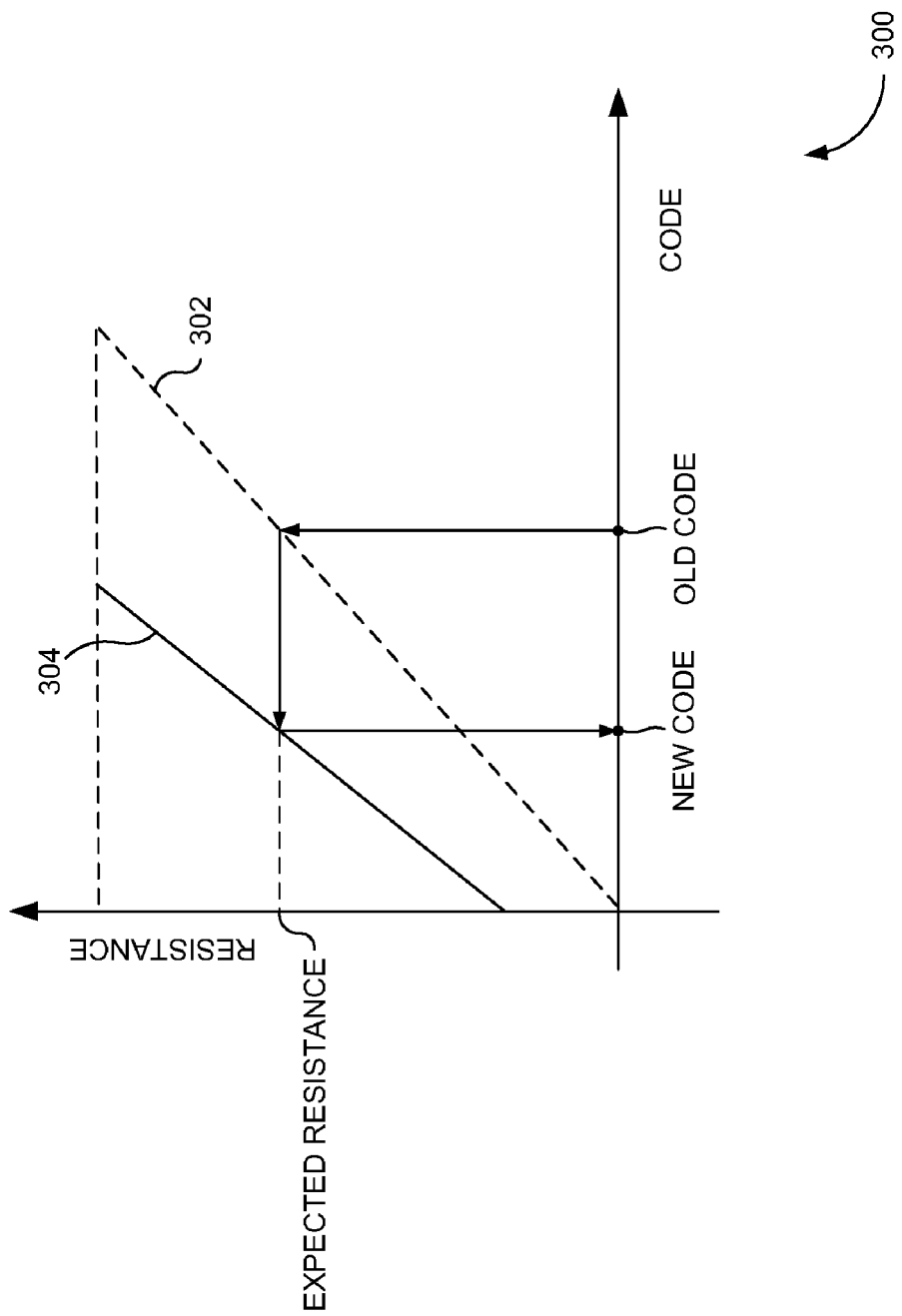
FIG. 3 is a graph illustrating resulting end-to-end tolerance error in output resistance due to process variability of VLSI technology using resistance versus inputted digital code characteristic curves of an expected RDAC and an actual RDAC, according to an embodiment.

FIG. 3 is a graph 300 illustrating resulting end-to-end tolerance error in output resistance due to process variability of VLSI technology using resistance versus inputted code (digital input code) characteristic curves of an expected RDAC and an actual RDAC 120, according to an embodiment. Particularly, FIG. 3 illustrates an ideal characteristic curve 302 and an actual characteristic curve 304 of the N+1 bit RDAC 120.

As explained above, due to variation in sheet resistivity, the slope of the actual characteristic curve 304 could change as shown in the FIG. 3.

For example, consider the ideal resistance value as $R_{WB}(K)$ and the actual resistance value as $R_{WB}(K_{NEW})$. Assume the resistances $R_{WB}(K)$ and $R_{WB}(K_{NEW})$ are marked somewhere on the ordinate corresponding to the digital code. Let the input digital input code (e.g., old code as shown in FIG. 3) is $D_K$. Further, the slope of the ideal characteristic curve 302 is given by $R_{WB}(K)/D_K$ and the slope of the actual characteristic curve 304 is given by $R_{WB}(K_{NEW})/D_K$. Therefore, the ideal characteristics can be obtained from the actual characteristics by multiplying the actual slope with the calibration factor.

For example, let the ideal slope=$R_{WB}(K)/D_K$, and actual slope=$R_{WB}(K_{NEW})/D_K$. Therefore, $R_{WB}(K)/D_K = R_{WB}(K_{NEW})/D_K * (R_{WB}(K)/R_{WB}(K_{NEW}))$. In this case, the calibration factor is $R_{WB}(K)/R_{WB}(K_{NEW})$ which could be easily determined using the above method.

In another example embodiment, the calibrated digital code is obtained corresponding to the ideal resistance value $R_{WB}(K)$ which intersects the actual characteristic curve 304 on the abscissa. Thus, the calibrated digital code (e.g., new code as shown in FIG. 3) is derived based on the resistance versus digital code characteristic curves of the expected RDAC and the RDAC 120 (e.g., characteristic curves 302 and 304 respectively).

Further, if the resistivity of resistor element goes below the nominal, then it may not be possible to get full scale ideal resistance by calibration. Therefore, the RDAC 120 needs to be over ranged to take care of this.

Figure 4:
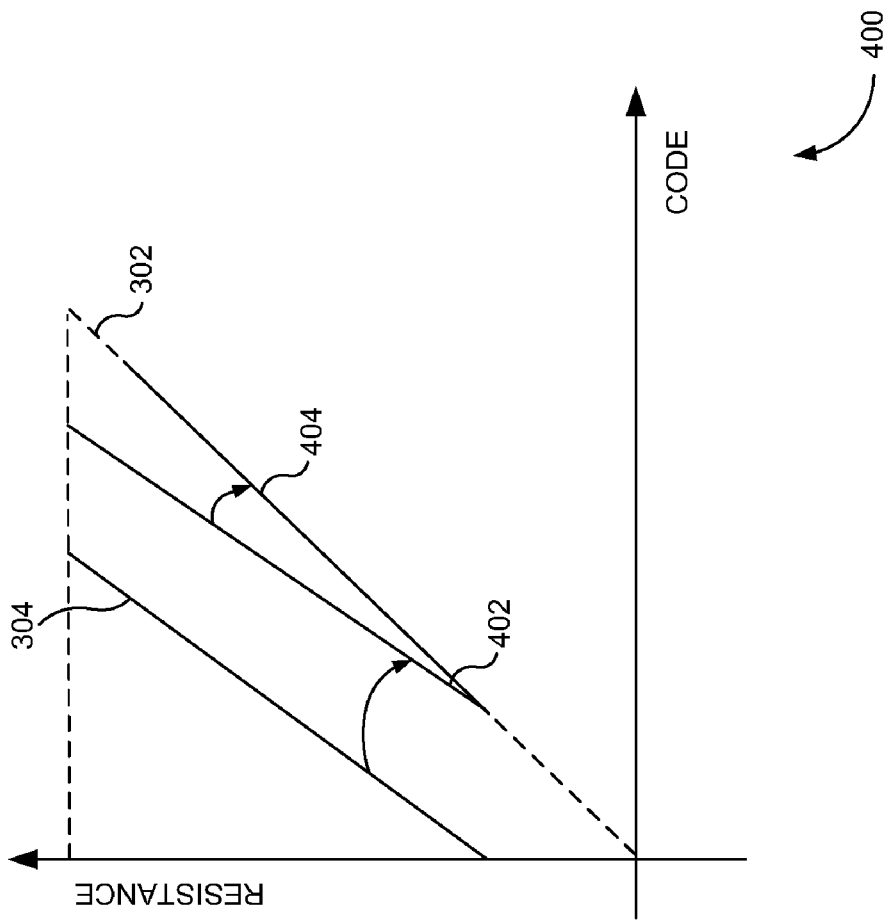
FIG. 4 is an example graph illustrating obtaining the expected resistance versus inputted digital code after making offset and gain error corrections to the actual obtained resistance versus inputted digital code, according to an embodiment.

FIG. 4 is an example graph 400 illustrating obtaining the expected resistance versus inputted digital code after making the offset and gain error corrections to the actual obtained resistance versus inputted digital code, according to an embodiment. Particularly, FIG. 4 illustrates obtaining the expected resistance characteristic curve (e.g., ideal characteristic curve 302) from the actual characteristic curve 304 using the derived calibrated digital code (e.g., new code illustrated in FIG. 3).

As shown in FIG. 4, the graph 400 depicts the ideal characteristic curve 302 and the actual characteristic curve 304. The characteristic curve 402 is obtained after making the offset error correction to the actual characteristic curve 304. Further, the characteristic curve 404 is obtained after making the gain error correction to the characteristic curve 402. As a result, the slope of the actual characteristic curve 304 is proportional to the slope of the ideal characteristic curve 302. In other words, the magnitude of the analog output thus generated, is proportional to the magnitude of the input digital code. Thus, the expected resistance is obtained using the calibrated digital code (new code) using the gain and offset error corrections.

For example, the calibrated digital code is calculated using the offset error and the gain error as follows. let $R_{WB}(K)'$ be the resistance calculated from the actual curve 304 and is given by $$R_{WB}(K)' = R_{OFF} + \alpha D_K R_{LSB}$$

where $R_{OFF}$ is the offset resistance, $\alpha$ is the gain error, $D_K$ is the inputted digital code and $R_{LSB}$ is an individual resistance.

Further, the offset resistance be given by $R_{OFF} = D_{OFF} R_{LSB}$, where, $D_{OFF}$ is the offset error. By substituting the value of $R_{OFF}$ in $R_{WB}(K)'$ equation, then the equation for $R_{WB}(K)'$ becomes, $$R_{WB}(K)' = (D_{OFF} + \alpha D_K) R_{LSB}.$$

Further, the resistance of the ideal transfer curve 302 is given by $R_{WB}(K) = D_K R_{LSB}$. For each k, we can find $K_{NEW}$ such that $R_{WB}(K_{NEW})' = R_{WB}(K)$.

By comparing the above two equations, $D_{OFF} + \alpha D_{KNEW} = D_K$. So, $D_{KNEW} = (D_K - D_{OFF})/\alpha$, where $D_{KNEW}$ is the calibrated digital code which is given by absolute value of difference between the digital code ($D_K$) and offset error ($D_{OFF}$) divided by the gain error.

Figure 5:
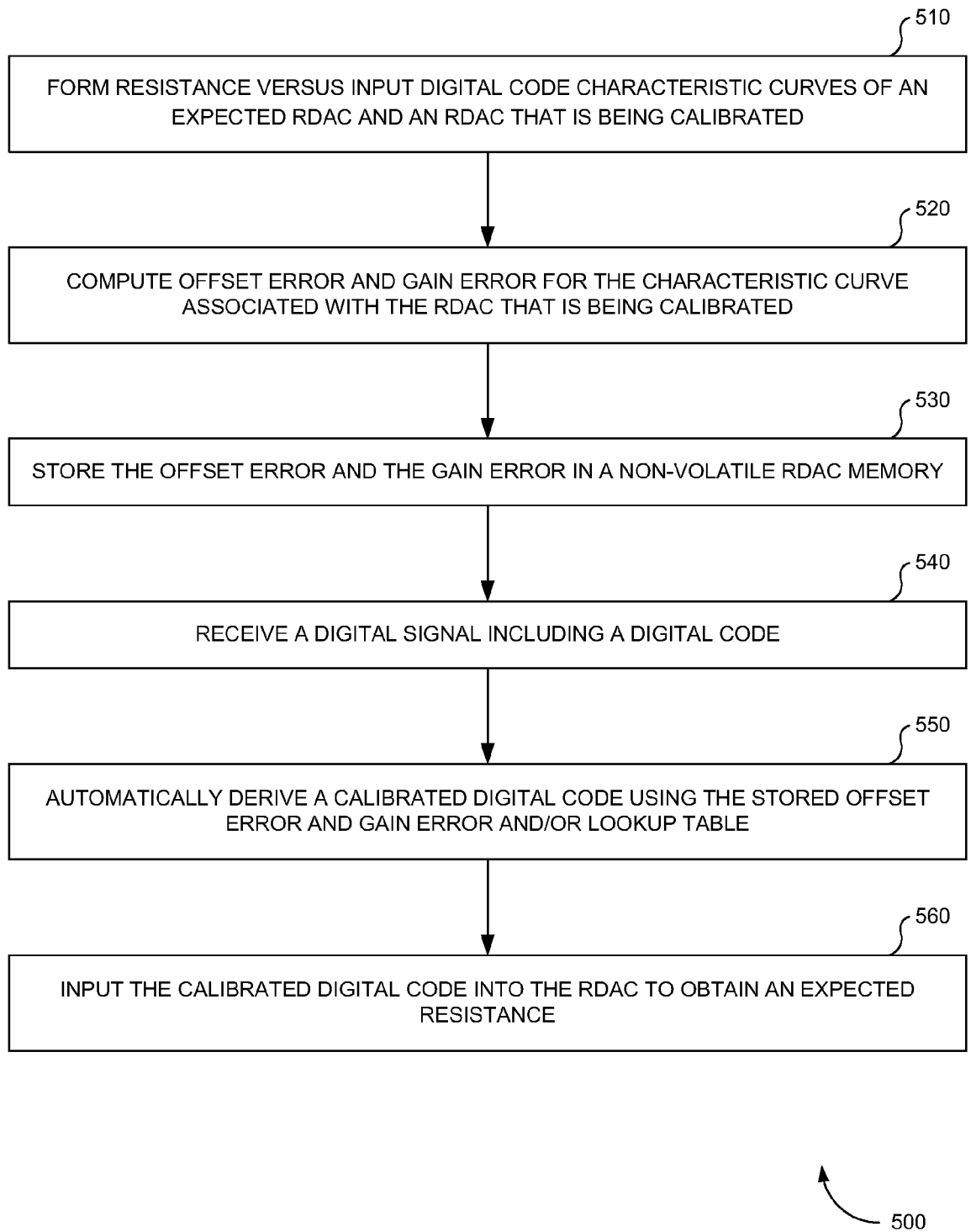
FIG. 5 is a process flow of calibrating RDACs, such as those shown in FIG. 1, for using in rheostat mode for end-to-end tolerance correction in output resistance, according to one embodiment.

FIG. 5 is a process flow 500 of calibrating RDACS, such as those shown in FIG. 1, for using in rheostat mode for end-to-end tolerance correction in output resistance, according to one embodiment. Particularly, FIG. 5 illustrates a method of obtaining an expected resistance from the RDAC circuit 100, according to an embodiment.

In operation 510, resistance versus digital code characteristic curves of an expected RDAC and an RDAC 120 are formed. In operation 520, a gain error and an offset error are computed using the formed resistance versus digital code characteristic curves of the RDAC 120 and the expected RDAC. In operation 530, the gain error and the offset error are stored in a non-volatile/volatile RDAC memory 130.

In operation 540, a digital signal including a digital code is received by an on-chip calibration code engine 110. In operation 550, a calibrated digital code is automatically derived using the stored offset error and the gain error. In these embodiments, the calibrated digital code is automatically derived based on the resistance versus digital code characteristic curves of the expected RDAC and the on-chip RDAC 120 associated with the on-chip calibration code engine 110.

Further in these embodiments, automatically deriving the calibrated digital code includes forming a look-up table of the received digital codes versus associated calibrated digital codes, storing the look-up table in the non-volatile/volatile RDAC memory 130, and automatically obtaining the calibrated digital code for the received digital code using the stored look-up table. In operation 560, the calibrated digital code is inputted into the RDAC 120 (e.g., associated with the on-chip calibration code engine 110) to obtain the expected resistance.

The above described calibration method would be trimmed digitally, which could be done by the end-user as well in the factory during on-the-fly production testing. Therefore, loss of time to market due to slow trimming process and loss of yield due to uneven trimming are reduced. The above-described calibration method is easy to implement.

The above described calibration method ensures that the INL/DNL errors would remain within specs, as long as there is an excess resolution in the RDAC 120. Further, the end-to-end resistance tolerance of the RDAC 120 is computed as a percentage of error at a certain digital code to the actual RDAC output at the digital code (e.g., not the full-scale output). Therefore, the limited excess resolution would limit the code loss at lower codes of the RDAC 120.

The foregoing disclosures and statements are illustrative only of the present invention, and are not intended to limit or define the scope of the present invention. The above description is intended to be illustrative, and not restrictive. Although the examples given include many specificities, they are intended as illustrative of only certain possible embodiments of the present invention. The examples given should only be interpreted as illustrations of some of the preferred embodiments of the present invention, and the full scope of the present invention should be determined by the appended claims and their legal equivalents. Those skilled in the art will appreciate that various adaptations and modifications of the just-described preferred embodiments can be configured without departing from the scope and spirit of the present invention. Therefore, it is to be understood that the present invention may be practiced other than as specifically described herein. The scope of the present invention as disclosed and claimed should, therefore, be determined with reference to the knowledge of one skilled in the art and in light of the disclosures presented above.

It will be appreciated that the various embodiments discussed herein may not be the same embodiment, and may be grouped into various other embodiments not explicitly disclosed herein.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method of calibrating a resistor digital-to-analog converter (RDAC), comprising:
   receiving a digital signal comprising a digital code by an RDAC; and
   automatically deriving a calibrated digital code based on resistance versus digital code characteristic curves of an expected RDAC and the RDAC for end-to-end tolerance correction in output resistance of the RDAC to obtain an expected resistance.

2. The method of claim 1, further comprising:
   inputting the calibrated digital code into the RDAC to obtain an expected resistance.

3. The method of claim 1, wherein automatically deriving the calibrated digital code based on resistance versus digital code characteristic curves comprises:
   automatically deriving the calibrated digital code based on parameters associated with the resistance versus digital code characteristic curves of the expected RDAC and the RDAC.

4. The method of claim 3, wherein the parameters comprise offset error and gain error.

5. The method of claim 4, wherein automatically deriving the calibrated digital code comprises:
   computing the calibrated digital code for each received digital code using the offset error and the gain error.

6. The method of claim 5, further comprising:
   storing the offset error and the gain error in memory.

7. The method of claim 4, wherein automatically deriving the calibrated digital code comprises:
   forming a look-up table of the received digital codes versus associated calibrated digital codes;
   storing the look-up table in a non-volatile/volatile RDAC memory; and
   automatically obtaining the calibrated digital code for the received digital code using the stored look-up table.

8. A method of obtaining an expected resistance from an RDAC (resistor digital-to-analog converter) circuit comprising:
   receiving a digital signal comprising a digital code by an on-chip calibration code engine;
   automatically deriving a calibrated digital code based on resistance versus digital code characteristic curves of an expected RDAC and an on-chip RDAC associated with the on-chip calibration code engine; and
   inputting the calibrated digital code from the on-chip calibration code engine into the RDAC associated with the on-chip calibration code engine to obtain an expected resistance.

9. The method of claim 8, further comprising:
   forming the resistance versus digital code characteristic curves of the expected RDAC and the RDAC;

computing a gain error and an offset error using the formed resistance versus digital code characteristic curves of the RDAC and the expected RDAC; and storing the gain error and the offset error in a non-volatile/volatile RDAC memory.

10. The method of claim 8, wherein automatically deriving the calibrated digital code comprises:

forming a look-up table of the received digital codes versus associated calibrated digital codes; storing the look-up table in a non-volatile/volatile RDAC memory; and automatically obtaining the calibrated digital code for the received digital code using the stored look-up table.

11. An RDAC circuit, comprising:

a calibration code engine configured to supply a calibrated digital code to a digital input array upon receiving a digital signal including a digital code; and a resistor digital to analog converter (RDAC) coupled to the calibration code engine, the resistor digital to analog converter including the digital input array and an analog output node, wherein the RDAC is configured to receive the calibrated digital code and output an expected resistance and wherein the calibrated digital code is derived from resistance versus digital code characteristic curves of an expected RDAC and the RDAC associated with the RDAC circuit to obtain the expected resistance.

12. The RDAC circuit of claim 11, wherein the RDAC further comprises: high and low analog reference voltage nodes;

first and second separate outer strings of respective predetermined series connected resistors, one end of the first outer resistor string being connected to the high reference voltage node and one end of the second outer resistor string being connected to the low reference voltage node, the resistors of each outer string being connected directly in series;

an inner string of series connected resistors; and first and second outer switch networks connected respectively to the first and second outer resistor strings to provide selectable unbuffered taps from the outer resistor strings to opposite ends of the inner resistor string to provide a selectable tap from the inner resistor string to the output node.

13. The RDAC circuit of claim 12, where the RDAC further comprises:

a decoder which responds to the received calibrated digital code by controlling the first and second outer switch networks to switch selected portions of the outer resistor strings into a series connection with said inner resistor string, the selected portions having a substantially constant aggregate series resistance over the switching ranges of the outer switch networks, the decoder further controlling the inner switch network to tap the inner resistor string at a location whose analog resistance level corresponds to the digital input signal, wherein the number and resistance values of the resistors in the outer resistor strings decrementing the voltage between the high and low reference voltage nodes in a maimer that corresponds to either the most significant hits (MSBs) or the least significant bits (LSBs) of the input digital signal, and the number and resistance values of the resistors in the inner resistor string decrementing the voltage between the outer resistor strings in a manner that corresponds to the other of the MSBs and LSBs.

14. The RDAC circuit of claim 13, wherein the decoder alters the switching pattern of the outer switch networks in response to a change in the input digital signal by first altering the switching switch network for the outer string that results in an increase in the total resistance between the high or low reference voltage nodes and the analog output node, and then altering the switching pattern of the switch network for the other outer string.

15. The RDAC circuit of claim 13, wherein the digital code comprises N bits and the DAC is configured to computationally process N plus one or more bits of digital input.

16. The RDAC circuit of claim 15, wherein a maximum resistance of the digital to analog converter equal to or greater than a desired maximum resistance divided by an over range factor, the over range factor equal to one minus a maximum expected sheet resistivity variation percentage.

17. The RDAC circuit of claim 13, wherein the first and second outer resistor strings have equal number of resistors with substantially equal resistances.

18. The RDAC circuit of claim 13, wherein each MSB resistor string includes $2^{N/2}-1$ equal value resistors.

19. The RDAC circuit of claim 18, wherein each LSB resistor string includes $2^{N/2}$ equal value resistors.

20. The RDAC circuit of claim 19, wherein the resistance value of each resistor in each MSB resistor string is $2^{N/2}$ times the resistance value of each resistor in each LSB resistor string.

21. The RDAC circuit of claim 13, further comprising:

memory for storing parameters associated with the resistance versus the digital code characteristic curve of RDAC.

22. The RDAC circuit of claim 21, wherein the memory comprises a non-volatile/volatile RDAC memory.

* * * * *